United States Patent
Minemura et al.

(10) Patent No.: US 8,624,314 B2
(45) Date of Patent: *Jan. 7, 2014

(54) SEMICONDUCTOR DEVICE AND METHOD FOR MANUFACTURING SEMICONDUCTOR DEVICE

(71) Applicants: Aya Minemura, Yokohama (JP); Kenji Sawamura, Yokohama (JP); Mitsuhiro Noguchi, Yokohama (JP)

(72) Inventors: Aya Minemura, Yokohama (JP); Kenji Sawamura, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/713,341

(22) Filed: Dec. 13, 2012

(65) Prior Publication Data

US 2013/0187208 A1    Jul. 25, 2013

Related U.S. Application Data

(63) Continuation of application No. 12/884,764, filed on Sep. 17, 2010, now Pat. No. 8,357,966.

(30) Foreign Application Priority Data

Mar. 23, 2010    (JP) .................................. 2010-066950

(51) Int. Cl.
    *H01L 29/76*    (2006.01)
    *H01L 21/8238*  (2006.01)

(52) U.S. Cl.
    USPC ........... 257/314; 257/618; 438/201; 438/257; 365/185.01; 365/185.1

(58) Field of Classification Search
    USPC .......... 438/201, 257, 593; 257/314–316, 618, 257/E29.3, E21.422, E21.68, E21.687
    See application file for complete search history.

(56) References Cited

U.S. PATENT DOCUMENTS

| | | | |
|---|---|---|---|
| 6,657,248 B1 | 12/2003 | Matsuzaki et al. |
| 7,622,762 B2 | 11/2009 | Kajimoto et al. |
| 7,638,878 B2 | 12/2009 | Aritome |
| 7,643,345 B2 | 1/2010 | Ishibashi |
| 7,652,319 B2 | 1/2010 | Tsurumi et al. |
| 2009/0039444 A1 | 2/2009 | Suzuki |
| 2009/0231921 A1 | 9/2009 | Kimura et al. |
| 2009/0278195 A1 | 11/2009 | Toba |
| 2010/0034020 A1 | 2/2010 | Tanaka et al. |
| 2010/0105180 A1 | 4/2010 | Ema et al. |
| 2010/0136787 A1 | 6/2010 | Aritome |

FOREIGN PATENT DOCUMENTS

| | | |
|---|---|---|
| JP | 01-243574 | 9/1989 |
| JP | 2001-015620 | 1/2001 |
| JP | 2006-302950 | 11/2006 |
| JP | 2007-048446 | 2/2007 |

OTHER PUBLICATIONS

Office Action mailed Aug. 21, 2012 in Japanese Patent Application No. 2010-066950 filed Mar. 23, 2010 (w/English language translation), 9 pages.

*Primary Examiner* — Hsien Ming Lee
(74) *Attorney, Agent, or Firm* — Oblon, Spivak, McClelland, Maier & Neustadt, L.L.P.

(57) ABSTRACT

According to one embodiment, a semiconductor device comprises an active area extending in a first direction, a contact plug located on a first portion of the active area, and a transistor located on a second portion adjacent to the first portion of the active area in the first direction. A width of a top surface area of the first portion in a second direction perpendicular to the first direction is smaller than that of a top surface area of the second portion in the second direction.

11 Claims, 8 Drawing Sheets

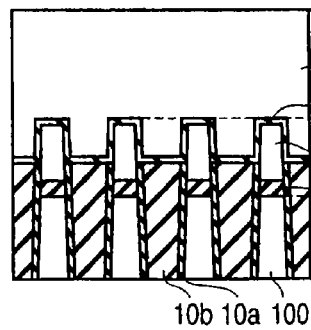 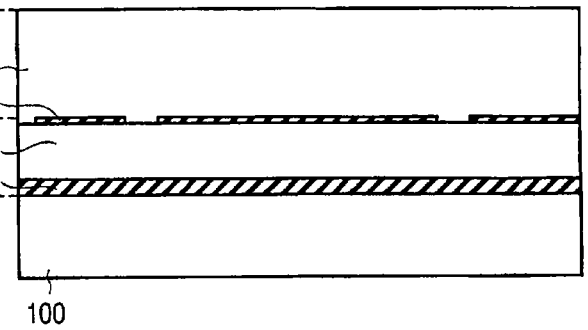
FIG. 6A  FIG. 6B
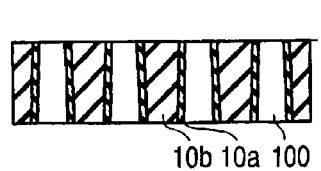 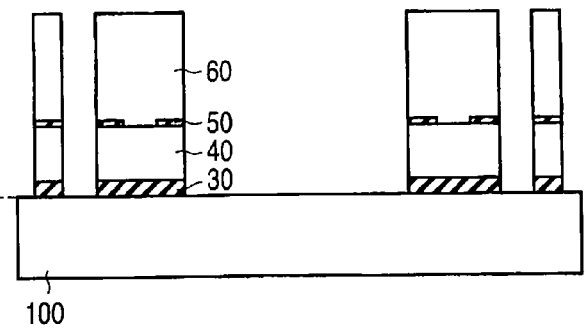
FIG. 7A  FIG. 7B
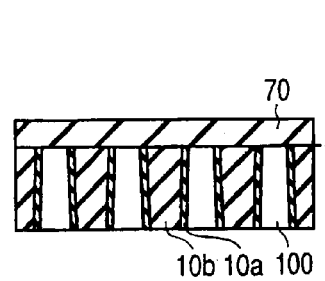 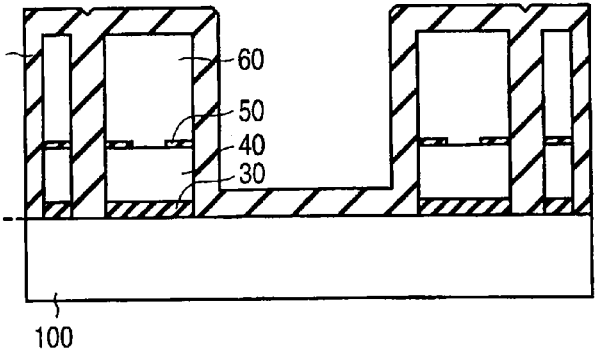
FIG. 8A  FIG. 8B

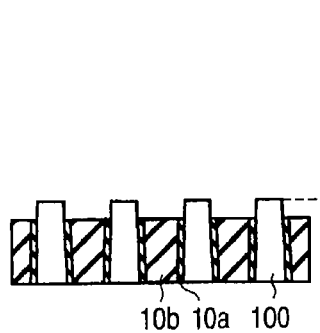
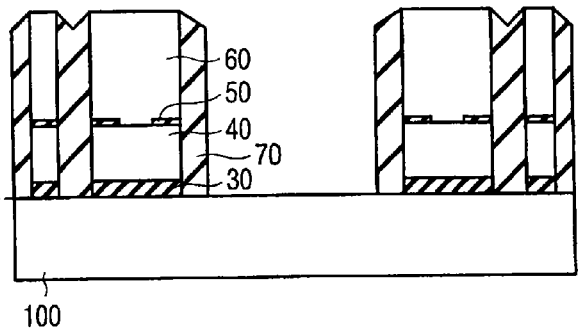
F I G. 9A  F I G. 9B
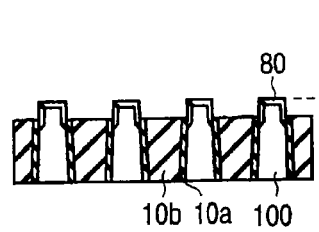
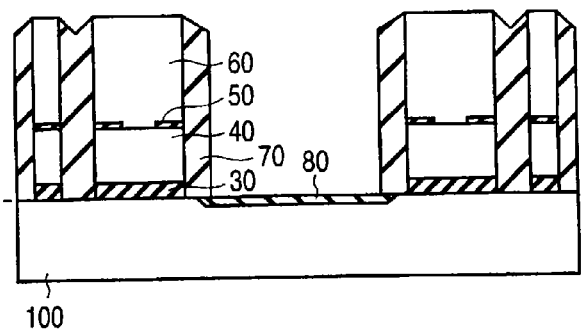
F I G. 10A  F I G. 10B
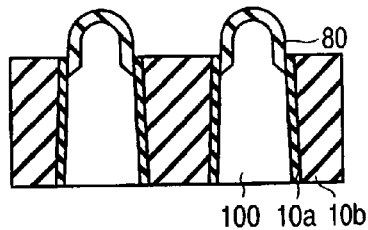
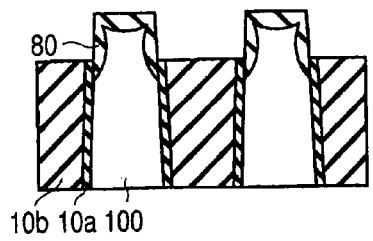
F I G. 11A  F I G. 11B

SEMICONDUCTOR DEVICE AND METHOD FOR MANUFACTURING SEMICONDUCTOR DEVICE

CROSS-REFERENCE TO RELATED APPLICATIONS

This application is a continuation of and claims the benefit of priority under 35 U.S.C. §120 from U.S. Ser. No. 12/884,764, filed Sep. 17, 2010 and claims the benefit of priority from Japanese Patent Application No. 2010-066950, filed Mar. 23, 2010; the entire contents of which are incorporated herein by reference.

FIELD

Embodiments described herein relate generally to a semiconductor device and a method for manufacturing a semiconductor device.

BACKGROUND

In recent years, miniaturization of semiconductor devices has led to a reduction in the line width of circuit patterns. Thus, there has been an increasing reduction in the distance between an active area serving as a diffusion layer and a channel and another adjacent active area. As a result, the withstand voltage between an active area in which a contact section is formed and another adjacent active area has been decreasing.

Thus, it has been difficult to form a semiconductor device with an appropriate withstand voltage between an active area in which a contact section is formed and another adjacent active area.

A related technique has been proposed in which a void portion is formed between adjacent floating gates and/or between adjacent control gates (see, for example, Jpn. Pat. Appln. KOKAI Publication No. 2006-302950). However, this technique is used for adjacent memory cell transistors. Hence, this technique fails to increase the withstand voltage between an active area in which a contact section is formed and another adjacent active area.

BRIEF DESCRIPTION OF THE DRAWINGS

FIG. 6A is a sectional view taken along the word line WL direction and schematically showing the basic method for manufacturing a semiconductor device according to the embodiment, and FIG. 6B is a sectional view taken along the bit line BL direction and schematically showing the basic method for manufacturing a semiconductor device according to the embodiment;

FIG. 7A is a sectional view taken along the word line WL direction and schematically showing the basic method for manufacturing a semiconductor device according to the embodiment, and FIG. 7B is a sectional view taken along the bit line BL direction and schematically showing the basic method for manufacturing a semiconductor device according to the embodiment;

FIG. 8A is a sectional view taken along the word line WL direction and schematically showing the basic method for manufacturing a semiconductor device according to the embodiment, and FIG. 8B is a sectional view taken along the bit line BL direction and schematically showing the basic method for manufacturing a semiconductor device according to the embodiment;

FIG. 9A is a sectional view taken along the word line WL direction and schematically showing the basic method for manufacturing a semiconductor device according to the embodiment, and FIG. 9B is a sectional view taken along the bit line BL direction and schematically showing the basic method for manufacturing a semiconductor device according to the embodiment;

FIG. 10A is a sectional view taken along the word line WL direction and schematically showing the basic method for manufacturing a semiconductor device according to the embodiment, and FIG. 10B is a sectional view taken along the bit line BL direction and schematically showing the basic method for manufacturing a semiconductor device according to the embodiment;

FIGS. 11A and 11B are sectional views taken along the word line WL direction and schematically showing the basic method for manufacturing a semiconductor device according to the embodiment;

DETAILED DESCRIPTION

In general, according to one embodiment, a semiconductor device comprises an active area extending in a first direction, a contact plug located on a first portion of the active area, and a transistor located on a second portion adjacent to the first portion of the active area in the first direction. A width of a top surface area of the first portion in a second direction perpendicular to the first direction is smaller than that of a top surface area of the second portion in the second direction.

An embodiment will be described below in detail with reference to the drawings. In the present embodiment, a NAND nonvolatile semiconductor memory device will be described in which a plurality of memory cell transistors are arranged in a word line direction and a bit line direction and in which a plurality of series connected memory cell transistors are provided between select transistors.

Embodiment

Figure 1:
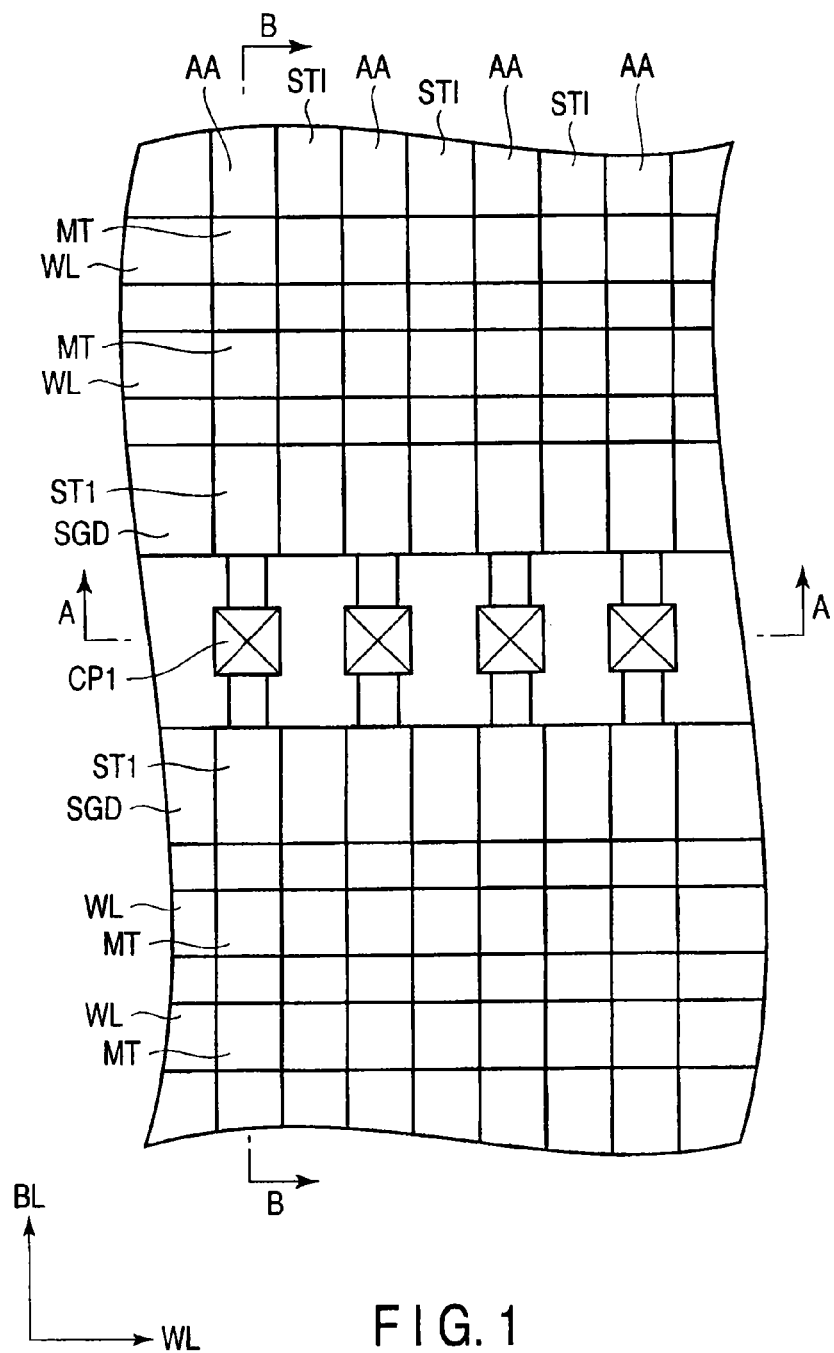
FIG. 1 is a plan view schematically showing the basic configuration of a semiconductor device according to an embodiment.
Figure 2:
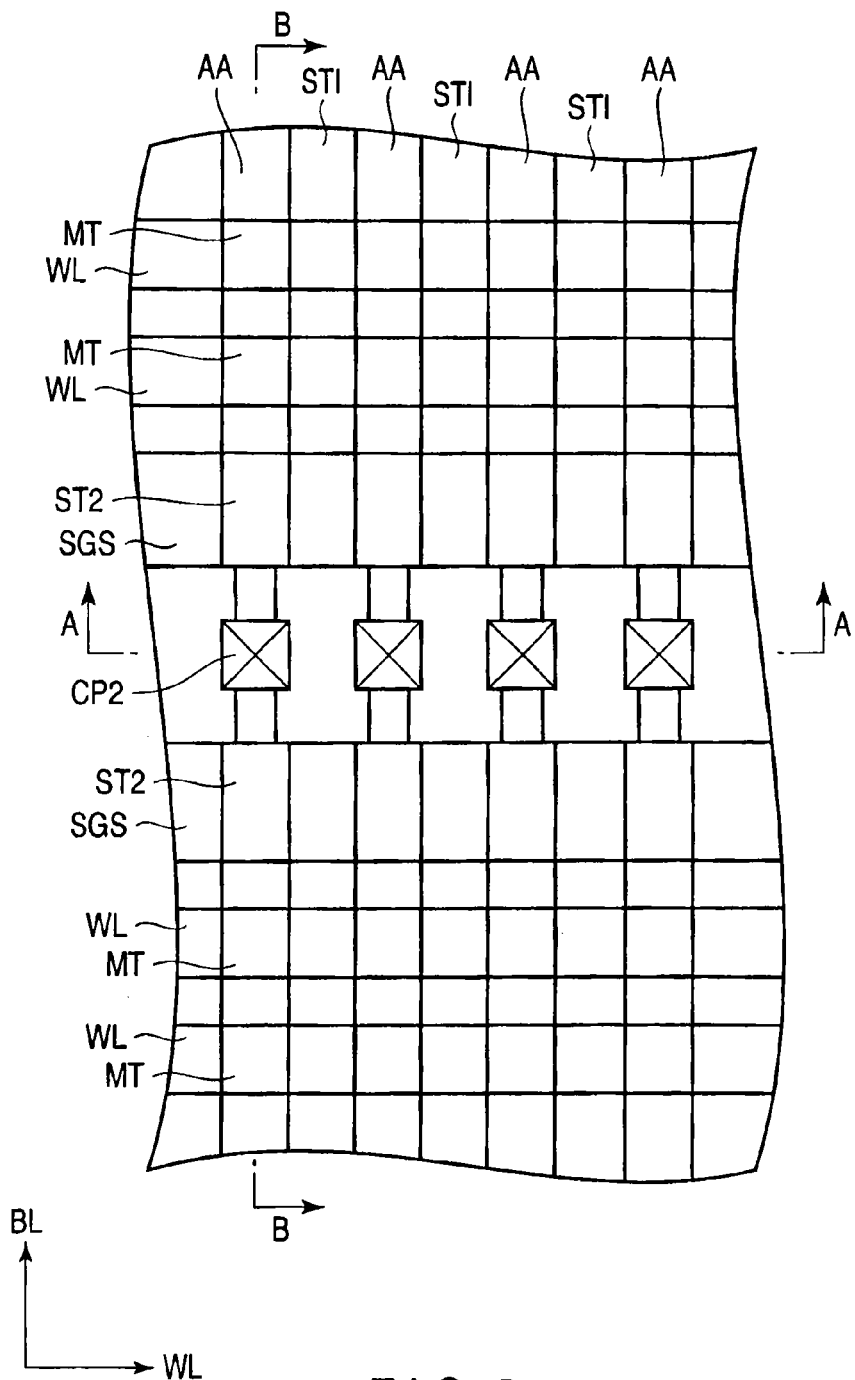
FIG. 2 is a plan view schematically showing the basic configuration of a semiconductor device according to the embodiment.
Figure 3:
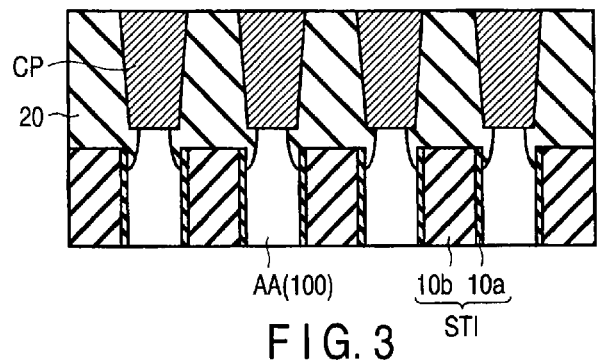
FIG. 3 is a sectional view taken along line A-A in FIGS. 1 and 2.

The basic configuration of the semiconductor device according to the embodiment will be described with reference to FIGS. 1 to 3. FIGS. 1 and 2 are plan views schematically showing the basic configuration of the semiconductor device according to the embodiment. FIG. 3 is a sectional view taken along line A-A in FIGS. 1 and 2.

As shown in FIGS. 1 and 2, active areas AA and shallow trench isolation regions STI are alternately arranged and extend in a bit line BL direction (first direction). The shallow trench isolation regions STI electrically separate the adjacent active areas AA from each other. Striped word lines WL and select gate lines SGD and SGS extending in a word line WL direction (second direction) are formed on a plurality of the active areas AA and a plurality of the shallow trench isolation regions STI. A memory cell transistor MT is provided in an area where the word line WL and the active area AA cross. A select transistor ST1 is provided in an area in which select gate line SGD and the active area AA cross. A select transistor ST2 is provided in an area in which select gate line SGS and the active area AA cross. An impurity diffusion layer is formed in the active area AA between the word lines WL adjacent to each other in the bit line BL direction and in the active area AA between the word line WL and each of select gate lines SGD and SGS; the impurity diffusion layer serves as a source area or a drain area of the memory cell transistor MT or select transistor ST1 or ST2.

An impurity diffusion layer formed in the active area AA of select transistor ST1 that is not adjacent to any memory cell transistor MT in the bit line BL direction functions as a drain area of select transistor ST1. A contact plug (contact section) CP1 is formed on the drain area. Contact plug CP1 is connected to one of the striped bit lines BL (not shown in the drawings) provided along the active area AA direction.

Furthermore, an impurity diffusion layer formed in the active area AA of select transistor ST2 that is not adjacent to any memory cell transistor MT in the bit line BL direction functions as a source area of select transistor ST2. A contact plug (contact section) CP2 is formed on the source area. Contact plug CP2 is connected to a source line SL (not shown in the drawings). For simplification of description, if contact plugs CP1 and CP2 are not distinguished from each other below, the contact plugs may be simply referred to as the contact plugs CP. Similarly, if select transistors ST1 and ST2 are not distinguished from each other below, the select transistors may be simply referred to as the select transistors ST.

The width, in the word line WL direction, of the active area AA functioning as the drain area of select transistor ST1 and the width, in the word line WL direction, of the active area AA functioning as the source area of select transistor ST2 are each smaller than that, in the word line WL direction, of the active area AA in which the source or drain area of the memory cell transistor MT, the source area of select transistor ST1, or the drain area of select transistor ST2 is formed.

As shown in FIG. 3, the width, in the word line WL direction, of the top surface area of a portion of the active area AA (100) in which the contact plug CP is formed is smaller than that, in the word line WL direction, of the top surface area of the remaining portion of the active area AA. Furthermore, the upper portion of the active area AA in which the contact plug CP is formed is about 2 to 4 nm thinner than the lower portion. More specifically, the width, in the word line WL direction, of a projecting (exposed) portion of the active area AA, which is projected from the shallow trench isolation region STI and the vicinity of the projecting portion is smaller than that, in the word line direction, of the lower portion of the active area AA. For example, the active area AA is separate from the shallow trench isolation region STI in the vicinity of the projecting portion of the active area AA. In other words, the width, in the word line WL direction, of the projecting portion of the active area AA and the vicinity of the projecting portion is smaller than that, in the word line WL direction, of the active area AA in which (the channel of) the memory cell transistor MT, (the channel of) select transistor ST1 or ST2, the source or drain area of the memory cell transistor MT, the source area of select transistor ST1, or the drain area of select transistor ST2 is formed. Furthermore, the shallow trench isolation regions STI each comprising a high temperature oxide (HTO) film 10a and a polysilasane (PSZ) film 10b are formed so as to separate the active areas 100 from each other. Additionally, an interlayer insulating film 20 is formed so as to separate the contact plugs CP from each other.

According to the above-described embodiment, the semiconductor device comprises the active area AA extending in the bit line BL direction, the contact plug CP located in the first portion of the active area AA, and the select transistor ST located on the second portion adjacent to the first portion of the active area in the bit line BL direction. The width of the top surface area of the first portion in the word line WL direction perpendicular to the bit line BL direction is smaller than that of the top surface area of the second portion in the word line WL direction. That is, the width, in the word line WL direction, of the active area AA functioning as the drain area of select transistor ST1 and the width, in the word line WL direction, of the active area AA functioning as the source area of select transistor ST2 are each smaller than that, in the word line WL direction, of the remaining portion of the active area AA. Thus, the adjacent active areas AA in which the respective contact plugs CP are formed are located sufficiently away from each other. As a result, effects are exerted which are similar to those of substantial increase in the pattern size between the adjacent active areas AA. This serves to increase the withstand voltage between the active area AA and of the contact plug CP formed in the adjacent active area AA.

Now, with reference to FIGS. 1, 2, 3, 4A, 4B, 5A, 5B, 6A, 6B, 7A, 7B, 8A, 8B, 9A, 9B, 10A, 10B, 11A, and 11B, a basic method for manufacturing a semiconductor device according to the present embodiment will be described in brief. FIGS. 4A to 10A are sectional views taken along the word line WL direction and schematically showing a basic method for manufacturing a semiconductor device according to the present embodiment. FIGS. 4B to 10B are sectional views taken along the bit line BL direction and schematically showing the basic method for manufacturing a semiconductor device according to the present embodiment. FIGS. 11A and 11B are sectional views taken along the word line WL direction and schematically showing the basic method for manufacturing a semiconductor device according to the present embodiment.

Figures 4A, 4B:
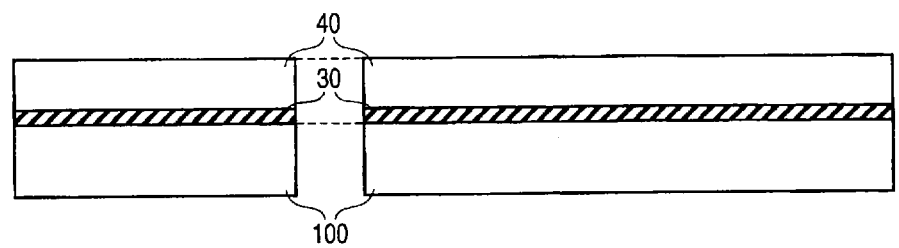
FIG. 4A is a sectional view taken along a word line WL direction and schematically showing a basic method for manufacturing a semiconductor device according to the embodiment.
FIG. 4B is a sectional view taken along a bit line BL direction and schematically showing the basic method for manufacturing a semiconductor device according to the embodiment.

First, as shown in FIGS. 4A and 4B, a silicon oxide film serving as a gate insulating film 30 is formed on a semiconductor substrate (silicon substrate) 100. Then, amorphous silicon (charge accumulation layer) 40 that is thermally converted into polysilicon is formed on the gate insulating film 30.

Figures 5A, 5B:
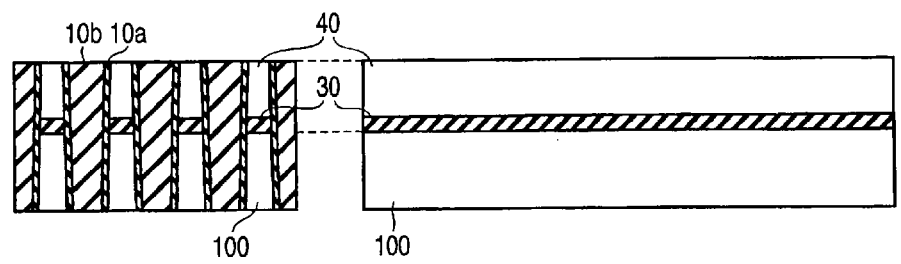
FIG. 5A is a sectional view taken along the word line WL direction and schematically showing the basic method for manufacturing a semiconductor device according to the embodiment.
FIG. 5B is a sectional view taken along the bit line BL direction and schematically showing the basic method for manufacturing a semiconductor device according to the embodiment.

Then, as shown in FIGS. 5A and 5B, a line-and-space-like mask pattern with a half pitch of about 19 nm (not shown in the drawings) is formed on the charge accumulation layer 40. The charge accumulation layer 40, the gate insulating film 30, and the silicon substrate 100 are etched. Thus, shallow trenches are formed. Then, an HTO film 10a is formed on the inner wall and bottom surface of the shallow trenches. A PSZ film 10b is formed on the HTO film 10a. The excess potions of PSZ film 10b and HTO film 10a are removed by CMP process. As a result, a shallow trench isolation region STI is formed which comprises the HTO film 10a and the PSZ film 10b.

Then, as shown in FIGS. 6A and 6B, the charge accumulation layer 40, the PSZ film 10b, and the HTO film 10a are processed by etch-back. After the etch-back, an NONON film is formed all over the resultant surface as an inter-electrode insulating film 50. The inter-electrode insulating film 50 in the select transistor portion is pre-patterned. Subsequently, an amorphous silicon film serving as a control gate electrode 60 is formed on the inter-electrode insulating film 50.

Then, as shown in FIGS. 7A and 7B, areas corresponding to the word lines WL and select gate lines SGD and SGS in FIGS. 1 and 2 are covered with a predetermined mask material pattern. Only in a space portion, the control gate electrode film 60, the inter-electrode insulating film 50, the charge accumulation layer 40, the gate insulating film 30, and the shallow trench isolation region STI are etched by the RIE method. Thus, in the space portion, the active area (semiconductor substrate) 100 may be exposed. As a result, a memory cell transistor MT structure is formed which comprises the gate insulating film 30 formed on the semiconductor substrate 100, the charge accumulation layer 40 formed on the gate insulating film 30, the inter-electrode insulating film 50 formed on the charge accumulation layer 40, and the control gate electrode 60 formed on the inter-electrode insulating film 50. Furthermore, a select transistor ST structure is formed which comprises the gate insulating film 30 formed on the semiconductor substrate 100, the amorphous silicon film formed on the gate insulating film 30 so as to form the charge accumulation layer 40, and amorphous silicon formed on the charge accumulation layer 40 so as to form the control gate electrode 60.

Then, as shown in FIGS. 8A and 8B, a silicon oxide film serving as a protective insulating film 70 is formed on the active area 100, the shallow trench isolation region STI, the memory cell transistor MT structure, and the select transistor ST structure. At this time, the film thickness of the silicon oxide film is such that the silicon oxide film is filled between the memory cell transistor MT structures adjacent to each other in the bit line BL direction and between the memory cell transistor MT structure and the select transistor ST structure but not between the select transistor ST structures adjacent to each other in the bit line BL direction. The protective insulating film 70 is used, for example, to protect the active area 100 and as an implantation spacer to be implanted later between the select transistors.

Then, as shown in FIGS. 9A and 9B, the protective insulating film 70 between the select transistor ST structures adjacent to each other in the bit line BL direction is removed by etch-back. At this time, the etch-back is carried out in a slightly over-etching manner to allow recession of the upper portion of the shallow trench isolation region STI between the select transistor ST structures adjacent to each other in the bit line BL direction. Thus, on the side of the select transistor ST structure which is not adjacent to the memory cell transistor MT structure, the upper portion of the active area 100 is projected (exposed) from the top surface of the shallow trench isolation region STI by about 1 to 2 nm. The etch-back is carried so as to prevent the protective insulating film 70 from being removed from between the memory cell transistor MT structures adjacent to each other in the bit line BL direction, from between the memory cell transistor MT structure and the select transistor ST structure, and from the sidewall of the select transistor ST structure.

Then, as shown in FIGS. 10A and 10B, a thermal oxidation process is carried out with the upper portion of the active area 100 projected from the top surface of the shallow trench isolation region STI. Thus, the top surface and sidewall (side surface) of the projected (exposed) active area 100 is oxidized by about 1 to 2 nm to form a silicon oxide film 80. As a result, the projected active area 100 is substantially slimmed to have the width thereof reduced in the word line WL direction. The degree to which the active area 100 is slimmed by oxidation is determined depending on contact resistance to a contact plug CP to be formed later. Any method may be used for this thermal oxidation process provided that the method allows the surface of the active area 100 to be oxidized.

When the upper portion and sidewall of the projected active area 100 are oxidized, the thermal oxidation process is carried out at 750° C. or higher for 30 seconds or longer. However, as shown in FIG. 11B, a low-temperature or short-time thermal oxidation process may reduce the film thickness of the oxide film in the corners of the projecting portion of the oxidized active area 100; the projecting portion of the active area 100 may have acute angles. Thus, the upper portion and sidewall of the projected active area 100 may have acute angles. This may undesirably cause electric fields to concentrate in the corners of the projecting portion of the active area 100. Thus, the process is desirably carried out at higher temperature for a longer time. For example, when the thermal oxidation process is carried out at a high temperature of about 850° C. or for a long time of about 10 minutes, silicon can be oxidized with the stress of the active area 100 released. Then, as shown in FIG. 11A, the corners of the projecting portion of the oxidized active area 100 can be rounded.

Thereafter, well-known techniques such as a thermal treatment step of crystallizing an amorphous silicon film into polysilicon and a step of forming a contact plug on the active area 100 are used to form a wiring layer and the like (not shown in the drawings) to complete a semiconductor device according to the present embodiment. Even if the insulating film 80 remains in the active area 100 or between contact plugs, the insulating film 80 need not particularly be removed because of its very small film thickness.

According to the above-described embodiment, the thermal oxidation process is carried out with the upper portion of the active area 100 projected from the shallow trench isolation region STI. Thus, the top surface and sidewall of the projected active area 100 can be oxidized, enabling a reduction in the width of the active area 100 in the word line direction. As a result, effects are exerted which are similar to those of a substantial increase in the pattern size between the adjacent active areas 100. This enables an increase in the withstand voltage between the active area AA and the contact plug CP formed in another active area AA adjacent to the above-described active area AA in the word line direction.

(Modification 1)

Now, the basic configuration of a semiconductor device according to Modification 1 of the present embodiment will be described with reference to FIGS. 12 to 14. In the above-described embodiment, the contact plugs CP are linearly arranged in the word line direction. In Modification 1, the case where the contact plugs CP are misaligned with one another in the word line WL direction will be described. The basic configuration and manufacturing method of Modification 1 are similar to those according to the above-described embodiment. Thus, matters described above in the embodiment or which can be easily analogized from the above-described embodiment will not be described below.

Figure 12:
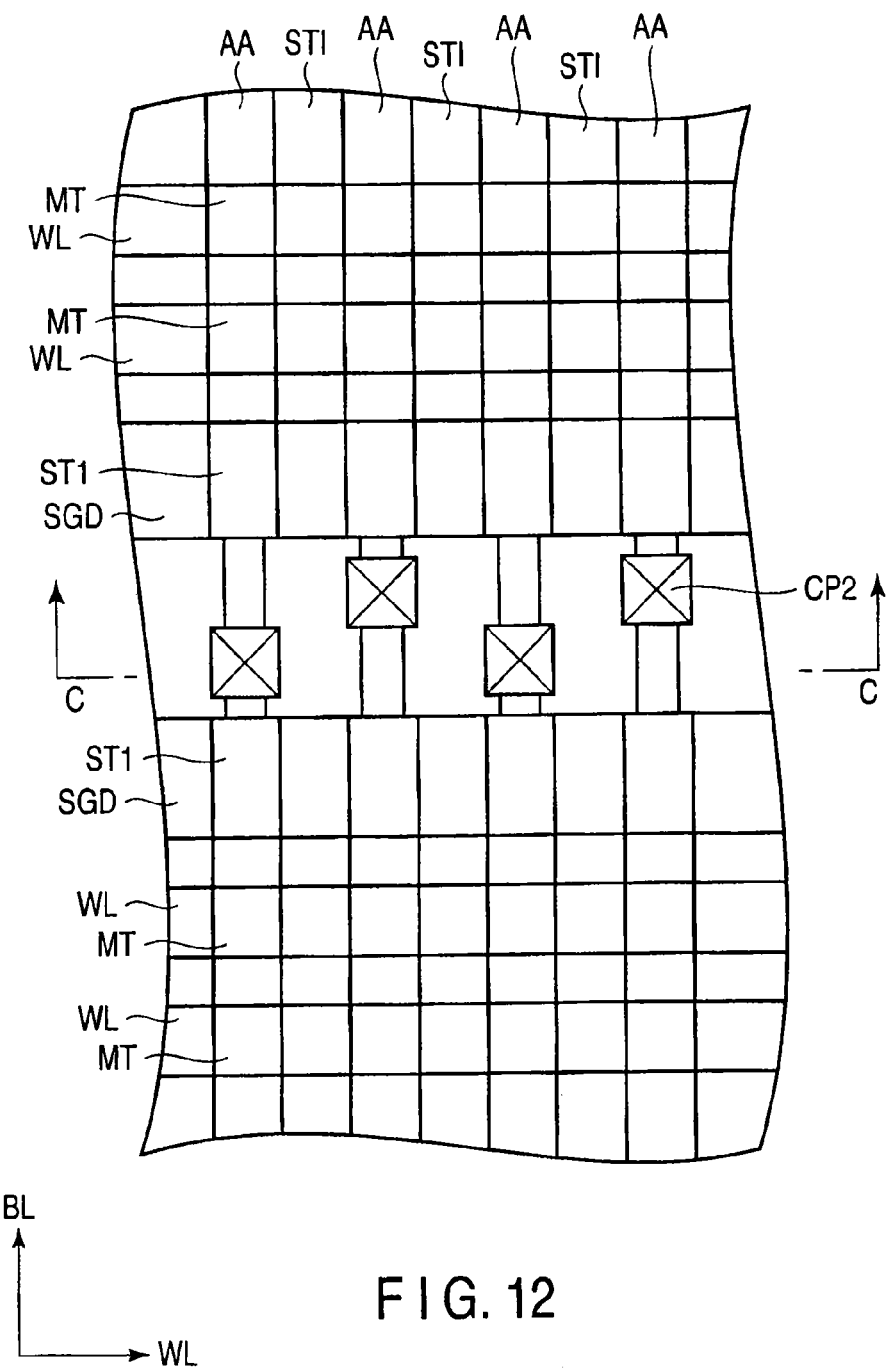
FIG. 12 is a plan view schematically showing the basic configuration of semiconductor devices according to modification 1 and modification 2 of the embodiment.
Figure 13:
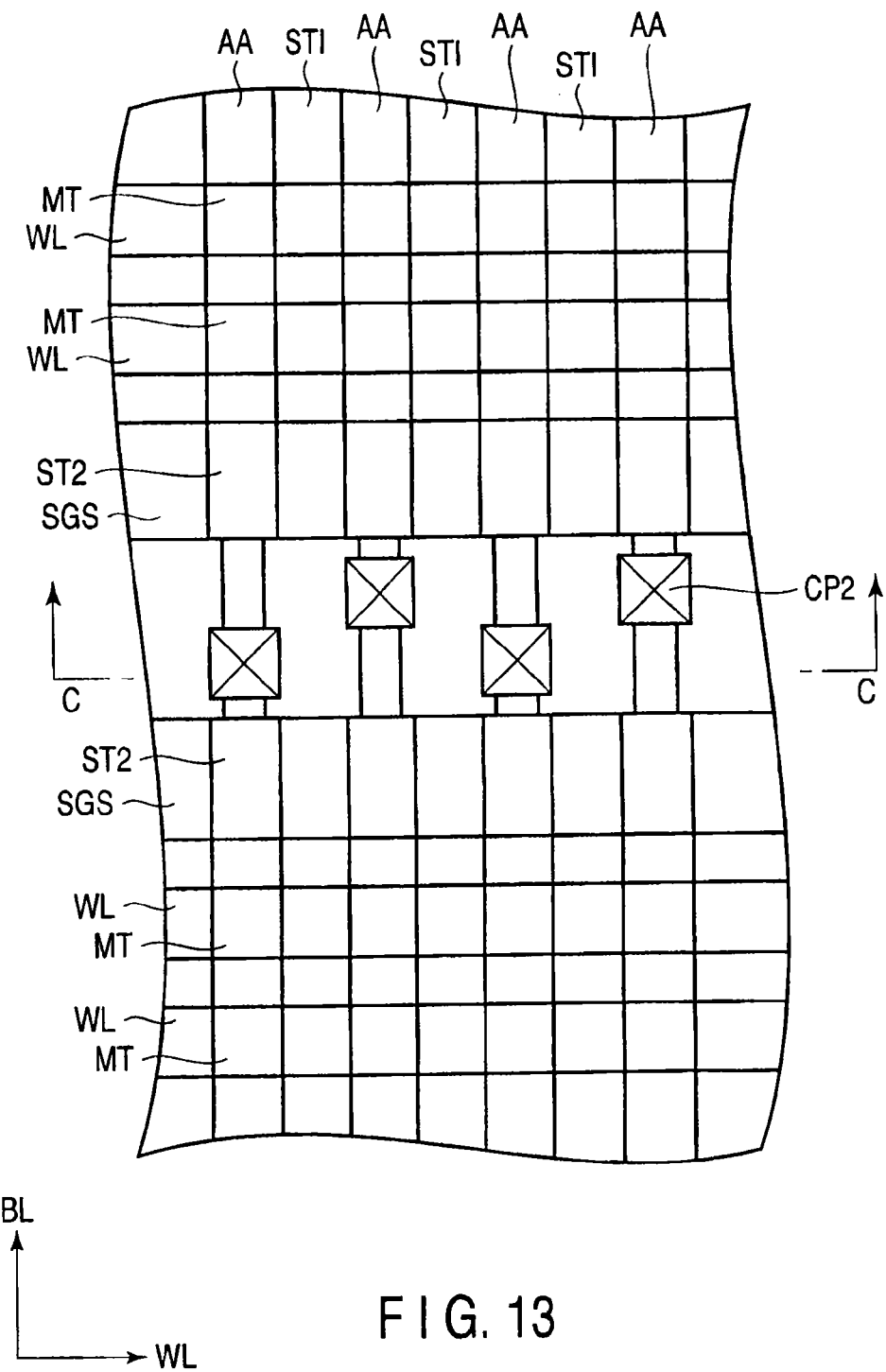
FIG. 13 is a plan view schematically showing the basic configuration of semiconductor devices according to modification 1 and modification 2 of the embodiment.

FIGS. 12 and 13 are plan views schematically showing the basic configuration of a semiconductor device according to Modification 1 of the present embodiment. FIG. 14 is a sectional view taken along line C-C in FIGS. 12 and 13.

As shown in FIGS. 12 and 13, active areas AA and shallow trench isolation regions STI are alternately arranged and extend in the bit line BL direction. Striped word lines WL and select gate lines SGD and SGS extending in the word line WL direction are formed on a plurality of the active areas AA and a plurality of the shallow trench isolation regions STI. A memory cell transistor MT is provided in an area where the word line WL and the active area AA cross. A select transistor ST1 is provided in an area in which select gate line SGD and the active area AA cross. A select transistor ST2 is provided in an area in which select gate line SGS and the active area AA cross. An impurity diffusion layer is formed in the active area AA between the word lines WL adjacent to each other in the bit line BL direction and in the active area AA between the word line WL and each of select gate lines SGD and SGS; the impurity diffusion layer serves as a source area or a drain area of the memory cell transistor MT or select transistor ST1 or ST2.

An impurity diffusion layer formed in the active area AA of select transistor ST1 that is not adjacent to any memory cell transistor MT in the bit line BL direction functions as a drain area of select transistor ST1. A contact plug CP1 is formed on the drain area. Contact plug CP1 is connected to one of the striped bit lines BL (not shown in the drawings) provided along the active area AA direction. Contact plugs CP1 are arranged zigzag rather than linearly in the word line direction.

Furthermore, an impurity diffusion layer formed in the active area AA of select transistor ST2 that is not adjacent to any memory cell transistor MT in the bit line BL direction functions as a source area of select transistor ST2. A contact plug (contact section) CP2 is formed on the source area. Contact plug CP2 is connected to a source line SL (not shown in the drawings). Contact plugs CP2 are arranged zigzag rather than linearly in the word line direction.

The width, in the word line WL direction, of the active area AA functioning as the drain area of select transistor ST1 and the width, in the word line WL direction, of the active area AA functioning as the source area of select transistor ST2 are each smaller than that, in the word line WL direction, of the active area AA in which (the channel of) the memory cell transistor MT, (the channel of) select transistor ST1 or ST2, the source or drain area of the memory cell transistor MT, the source area of select transistor ST1, or the drain area of select transistor ST2 is formed.

Figure 14:
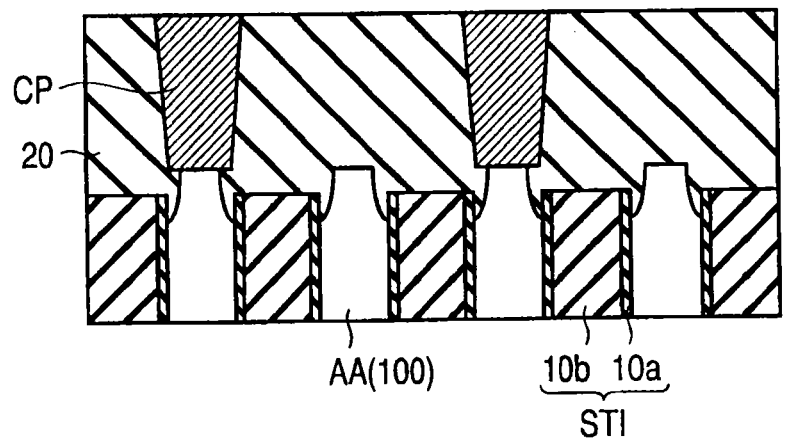
FIG. 14 is a sectional view taken along line C-C in FIGS. 12 and 13.

As shown in FIG. 14, the width, in the word line WL direction, of the top surface area of a portion of the active area AA (100) in which the contact plug CP is formed is smaller than that, in the word line WL direction, of the top surface area of the remaining portion of the active area AA. For example, the upper portion of the active area AA in which the contact plug CP is formed is about 2 to 4 nm thinner than the lower portion. Furthermore, the shallow trench isolation regions STI each comprising a HTO film 10$a$ and a PSZ film 10$b$ are formed so as to separate the active areas 100 from each other. Additionally, an interlayer insulating film 20 is formed so as to separate the contact plugs CP from each other.

According to Modification 1 described above, the width, in the word line WL direction, of the active area AA functioning as the drain area of select transistor ST1 and the width, in the word line WL direction, of the active area AA functioning as the source area of select transistor ST2 are each smaller than that, in the word line WL direction, of the remaining portion of the active area AA. Thus, the adjacent active areas AA in which the respective contact plugs CP are formed are located sufficiently away from each other. As a result, effects are exerted which are similar to those of substantial increase in the pattern size between the adjacent active areas 100. Furthermore, the contact plugs CP are provided zigzag in the word line WL direction, thus increasing the distance between the adjacent contact plugs CP. This serves to further increase the withstand voltage between a portion of the active area AA in which the contact plug CP is formed and a portion of another active area AA adjacent to the above-described active area AA in the word line direction in which portion the contact plug CP is not formed.

(Modification 2)

Now, the basic configuration of a semiconductor device according to Modification 2 of the present embodiment will be described with reference to FIGS. 12, 13, and 15. In Modification 2, a contact plug CP covers the top surface and side surface of a projected active area AA. The basic configuration and manufacturing method of Modification 2 are similar to those according to the above-described embodiment and Modification 1. Thus, matters described above in the embodiment and Modification 1 or which can be easily analogized from the above-described embodiment and Modification 1 will not be described below.

Figure 15:
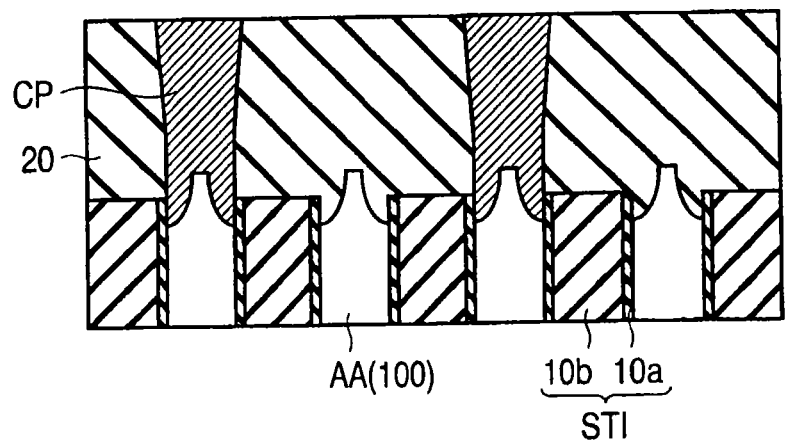
FIG. 15 is a sectional view taken along line C-C in FIGS. 12 and 13.

FIG. 15 is a sectional view taken along line C-C in FIGS. 12 and 13.

A semiconductor device according to Modification 2 has the structure described in FIGS. 12 and 13. As shown in FIG. 15, the upper portion of the active area AA (100) in which the contact plug CP is formed is about 2 to 4 nm thinner than the lower portion. Moreover, the contact plug CP covers the upper portion of the slimmed active area AA. Furthermore, shallow trench isolation regions STI each comprising a HTO film 10$a$ and a PSZ film 10$b$ are formed so as to separate the active areas 100 from each other. Additionally, an interlayer insulating film 20 is formed so as to separate the contact plugs CP from each other.

According to Modification 2 described above, as is the case with the above-described embodiment, the width, in the word line WL direction, of the active area AA functioning as the drain area of select transistor ST1 and the width, in the word line WL direction, of the active area AA functioning as the source area of select transistor ST2 are each smaller than that, in the word line WL direction, of the remaining portion of the active area AA. Thus, the adjacent active areas AA in which the respective contact plugs CP are formed are located sufficiently away from each other. As a result, effects are exerted which are similar to those of substantial increase in the pattern size between the adjacent active areas 100. Furthermore, the contact plugs CP are provided zigzag in the word line WL direction, thus increasing the distance between the adjacent contact plugs CP. This serves to further increase the withstand voltage between a portion of the active area AA in which the contact plug CP is formed and a portion of another active area AA adjacent to the above-described active area AA in the word line direction in which portion the contact plug CP is not formed. Moreover, the contact plug CP covers the upper portion of the slimmed active area 100. Thus, even if the active area 100 is slimmed so as to have a width smaller than that of the contact plug CP in the word line WL direction, an increase in contact resistance can be suppressed.

In the above-described embodiment, the distance between the select transistors ST along the bit line BL direction is such that the protective insulating film 70 is not filled between the select transistors ST. However, the distance can be appropriately varied depending on the arrangement of the contact plugs CP.

Furthermore, in Modification 1 and Modification 2 described above, the contact plugs CP are arranged to align with every other active area AA in the word line WL direction. However, the present invention is not limited to this aspect. Each contact plug CP may be arranged to align with every third active areas AA.

Furthermore, in the above-described embodiment, each insulating film is a silicon oxide film (including a PSZ film and an HTO film). However, the present invention is not limited to this aspect. Furthermore, amorphous silicon is used as the charge accumulation layer 40. However, the charge accumulation layer 40 may be a charge-trapping insulating film (for example, a silicon nitride film) that holds charges. Additionally, the NONON film is used as the inter-electrode insulating film 50. However, any insulator offering a larger dielectric constant than silicon oxide may be used. Moreover, amorphous silicon (thermally converted into polysilicon) is used as the control gate electrode 60. However, any material functioning as a control gate electrode may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an active area extending in a first direction;
   a contact plug located on a first portion of the active area; and
   a transistor located on a second portion adjacent to the first portion of the active area in the first direction,
   wherein a width of a top surface area of the first portion in a second direction perpendicular to the first direction is smaller than that of a top surface area of the second portion in the second direction, and
   wherein, in a cross section parallel to the second direction, the top surface area of the first portion is rounded.

2. The device according to claim 1, wherein in the second direction, a plurality of the active areas and a plurality of isolation regions are alternately arranged.

3. The device according to claim 2, wherein the top surface area of the first portion is higher than a top surface of the isolation region.

4. The device according to claim 3, wherein a width, in the second direction, of the first portion at a position higher than the top surface of the isolation region is smaller than a width, in the second direction, of the first portion at a position lower than the top surface of the isolation region.

5. The device according to claim 3, wherein the width, in the second direction, of the top surface area of the first portion is smaller than a width of the contact plug in the second direction.

6. The device according to claim 5, wherein the contact plug covers a top surface and a side surface of the first portion.

7. The device according to claim 2, wherein, in the second direction, a plurality of the contact plugs located on the respective first portions of the active areas are linearly arranged.

8. The device according to claim 2, wherein, in the second direction, a plurality of the contact plugs located on the respective first portions of the active areas are arranged zigzag.

9. The device according to claim 1, wherein the first portion includes a source area or a drain area of the transistor.

10. The device according to claim 9, wherein the second portion includes a drain area or a source area of the transistor.

11. The device according to claim 1, wherein the transistor is a select transistor.

* * * * *